United States Patent [19]

Arai

[11] Patent Number: 4,571,542
[45] Date of Patent: Feb. 18, 1986

[54] METHOD AND UNIT FOR INSPECTING PRINTED WIRING BOARDS

[75] Inventor: Kozo Arai, Kawasaki, Japan

[73] Assignee: Japan Synthetic Rubber Co., Ltd., Tokyo, Japan

[21] Appl. No.: 506,617

[22] Filed: Jun. 22, 1983

[30] Foreign Application Priority Data

Jun. 30, 1982 [JP] Japan .................. 57-111496
Sep. 22, 1982 [JP] Japan .................. 57-163942
Dec. 27, 1982 [JP] Japan .................. 57-226595

[51] Int. Cl.$^4$ ............... G01R 31/02; H01C 10/10
[52] U.S. Cl. ................. 324/158 P; 324/158 F; 338/99; 338/114
[58] Field of Search ........... 324/158 R, 158 P, 158 F; 338/99, 114; 339/278 D

[56] References Cited

U.S. PATENT DOCUMENTS

| 4,115,735 | 9/1978 | Stanford | 324/158 F |
| 4,258,100 | 3/1981 | Fujitani et al. | 338/114 X |
| 4,302,361 | 11/1981 | Kotani et al. | 338/114 X |
| 4,357,266 | 11/1982 | Sado et al. | 338/114 X |

FOREIGN PATENT DOCUMENTS

| 45473 | 3/1982 | Japan | 324/158 R |
| 123478 | 7/1983 | Japan | 324/158 R |
| 155374 | 9/1983 | Japan | 324/158 R |

OTHER PUBLICATIONS

IBM Technical Disclosure Bulletin, Holmstrom, L., "Electrical Fixture for Printed-Circuit Assemblies", vol. 20, No. 8, Jan. 1978, p. 2934.

Primary Examiner—Stewart J. Levy
Assistant Examiner—Stephen M. Baker
Attorney, Agent, or Firm—Oblon, Fisher, Spivak, McClelland & Maier

[57] ABSTRACT

A method for inspecting printed wiring boards which comprises superposing, on a printed wiring board to be inspected, a pressure-sensitive, electroconductive, elastic sheet, any portions of which become electroconductive in the direction of thickness of the elastic sheet when the portions have been pressed in the same direction, pressing the elastic sheet at portions corresponding to the electroconductive portions of said board by the use of inspecting electrodes, thereby electrically connecting the corresponding inspecting electrodes to the intended electroconductive portions of the printed wiring board. In said method, there is preferably used an inspecting unit which comprises the above-mentioned elastic sheet and an insulating, inspecting-electrode-holding plate provided so as to face the other side of said elastic sheet at a space, said inspecting electrode-holding plate holding a group of inspecting electrodes projecting from the plate surface into the space, said group of inspecting electrodes being arranged so as to correspond to an arrangement pattern of electroconductive portions of the printed wiring board to be inspected, and the inspecting electrode-holding plate being provided so that it can be relatively pressed in the direction of approaching the printed wiring board.

13 Claims, 19 Drawing Figures

METHOD AND UNIT FOR INSPECTING PRINTED WIRING BOARDS

This invention relates to a method for inspecting printed wiring boards and an inspecting unit for used therein.

Generally, in printed wiring boards, prior to fixing functional elements such as transistors, diodes, resistors and the like on these boards, it is necessary to inspect correct formation of intended circuit patterns. This inspection is carried out by examining conduction of electricity between electroconductive portions formed around holes into which functional elements are inserted, namely, through-holes (hereinafter, these electroconductive portions are referred to as through-hole portions).

In an example of conventional inspection method, as shown in FIG. 1 of the accompanying drawings, there is used an inspecting unit which comprises an insulating, probe-holding plate 1' and probes 2' of, for example, gold-plated pins, the probes 2' being inserted into the probe-holding plate 1' so that they can freely progress or regress, at positions corresponding to the through-hole portions 5 of a printed wiring board 4 to be inspected and each probe 2' being provided with a spring 100 so that the front end part 21 of the probe 2' projects from the surface of the probe-holding plate 1' by a considerable distance; and the inspecting method comprises connecting each probe 2' to a measuring device 6 containing a built-in computer, superposing the probe-holding plate 1' on the printed wiring board 4, pressing the plate 1' or the board 4 to contact each probe 2' with the corresponding through-hole portion 5, thereby forming electrical connection, and inspecting the conduction of electricity between the through-hole portions in this state. The reason why each probe 2' is of movable type and provided with the spring 100 in the above inspecting unit is that the contact of each probe 2' with the corresponding through-hole portion 5 is ensured even if the printed wiring board 4 has warps and/or surface unevennesses and is not completely flat.

However, in the case of such an inspecting unit, the production cost is very high because each probe 2' must be movable and provided with the spring 100, and furthermore, the number of the probes 2' is generally considerably large and each probe 2' requires gold plating and one inspecting unit is applicable only to one particular printed wiring board 4 having an arrangement pattern of through-hole portions 5 corresponding to the arrangement of the probes 2' of the inspecting unit.

Also, in carrying out inspection by the use of such an inspecting unit, it is necessary to ensure electrical contact between the probe 2' and the corresponding through-hole portion 5, and for achieving this, a load as large as 100 to 200 g must be applied to each probe 2'. Accordingly, a total load as large as 100 kg–200 kg need be applied if the total number of probes 2' is 1000. There is a high possibility of this too strong pressure damaging the through-hole portions 5.

In respect of the printed wiring board 4, it is in some cases specified that the through-hole portions 5 be arranged in a given lattice pattern. In this case, there is an inspecting unit called "universal type" wherein probes 2' are placed in a lattice pattern at all positions corresponding to those at which there is a possibility of through-hole portions 5 being formed. However, with this inspecting unit, it follows that the probes 2' contact even the portions of the printed wiring board 4 that through-hole portions are not formed, and as described previously, a large load is applied to each probe 2'. Therefore, there is a great possibility of the printed wiring circuit being damaged. Moreover, with this unit, the total number of probes 2' becomes large and consequently, a large pressing pressure is required as a whole and the unit comes to have a large size.

This invention has been brought about under the above background. An object of this invention is to provide a method for inspecting a printed wiring board wherein the use of a very simple means ensures an electrical contact with electroconductive portions of a printed wiring board and enables a reliable inspection to be carried out.

Another object of this invention is to provide an inexpensive unit for inspecting a printed wiring board, which has a simple structure and can be preferably used in carrying out the above-mentioned inspecting method.

The method for inspecting a printed wiring board according to this invention is characterized by including steps of superposing, on a printed wiring board to be inspected, a pressure-sensitive electroconductive elastic sheet, any portions of which become electroconductive in the direction of thickness of the elastic sheet when the portions have been pressed in the same direction, pressing the portions of the elastic sheet corresponding to the electroconductive portions of said board by the use of inspecting electrodes, thereby electrically connecting the corresponding inspecting electrodes to the intended electroconductive portions of the printed wiring board.

The unit for inspecting a printed wiring board according to this invention is characterized by comprising a pressure-sensitive electroconductive elastic sheet superposed on a printed wiring board to be inspected, any portions of said elastic sheet becoming electroconductive in the direction of thickness of the elastic sheet when the portions have been pressed in the same direction, an insulating, inspecting-electrode-holding plate provided so as to face at a space the side of said elastic sheet opposite to the side to be contacted with the printed wiring board, said inspecting electrode-holding plate holding a group of many inspecting electrodes projecting from the surface of the inspecting electrode-holding plate into the space, said group of many inspecting electrodes being arranged so as to correspond to an arrangement pattern of electroconductive portions of the printed wiring board to be inspected, the inspecting electrode-holding plate being provided so that it can be pressed in the direction of approaching the printed wiring board.

This invention is explained below referring to the accompanying drawings. In the drawings, FIG. 1 is a vertically sectional side view illustrating a conventional unit for inspecting a printed wiring board;

Figure 14:
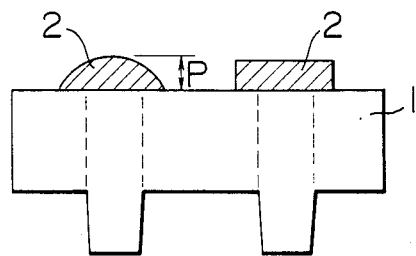
FIG. 14 is a cross-sectional view of the tops of inspecting electrodes.
Figure 15A:
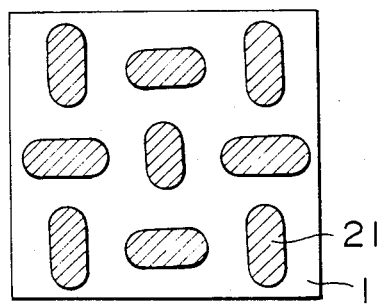
Figure 15B:
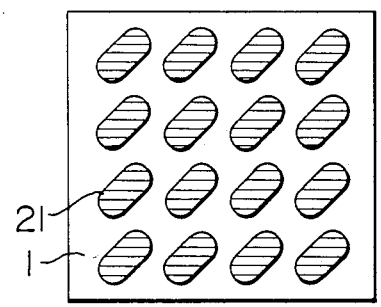

FIGS. 15a and 15b are plan views illustrating the shape and arrangement of front end parts of preferable inspecting electrodes in this invention. In FIGS. 1 to 15b, 1' represents a probe-holding plate, 1 an inspecting electrode-holding plate, 2' a probe, 2 an inspecting electrode, 3 an elastic sheet, 4 a printed wiring board, 5 a through-hole portion, 6 a measuring device, 7 a combining member, 8 a supporting plate, 81 a cushion layer, 91 a holding portion, 92 a reinforcing plate, 93 a concave portion, S a space, X an electrode, Y an electrode-holding plate +=and Z an electrode unit.

Figure 2A:
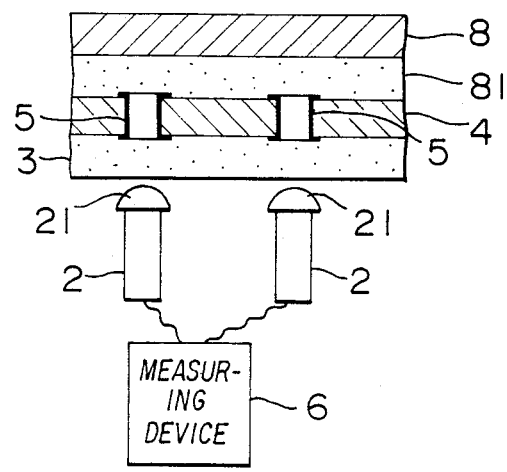
FIGS. 2a and 2b illustrate steps of the method for inspecting a printed wiring board according to this invention.
Figure 2B:
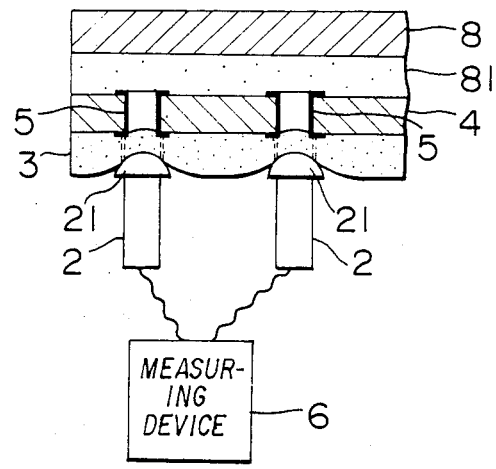

In the present method, printed wiring boards are inspected as follows: As illustrated in FIGS. 2a and 2b, a printed wiring board 4 to be inspected is superposed on a pressure-sensitive electroconductive elastic sheet 3, any portions of which become electroconductive in the direction of thickness of the elastic sheet when the portions have been pressed in the same direction, and at the same time, if necessary, a supporting plate 8 is superposed on the other wide of the printed board 4 through a cushion layer 81 made of a sponge or the like. A pair of through-hole portions are chosen from the through-hole portions 5 of the printed wiring board 4; a porton of the elastic sheet 3 located on one of the two through-hole portions is pressed from the other side of the elastic sheet 3 by the front end part 21 of an inspecting electrode 2 connected to a measuring device 6 containing a built-in computer and accordingly is pressed between the inspecting electrode 2 and the supporting plate 8, whereby a portion of the elastic sheet 3 between the edge part of said one of the two through-hole portions of the printed wiring board 4 and the corresponding inspecting electrode 2 is made electroconductive as shown by broken lines and electrical connection is obtained between the inspecting electrode 2 and said one of the two through-hole portions. At the same time, a portion of the elastic sheet 3 located on the other of the two through-hole portions is pressed by another inspecting electrode 2, whereby conduction of electricity between the through-hole portions chosen is examined; and thus the printed wiring board 4 is inspected.

Because printed wiring boards 4 are inspected as mentioned above in this invention, the following advantages are obtained from the present method:

1. Because the elastic sheet 3 is in contact with the surface of the printed wiring board 4, there is no possibility of a large pressure being locally applied to the printed wiring board 4 even when the other side of the elastic sheet 3 is pressed by an inspecting electrode 2. Accordingly, there is no fear of the printed wiring board 4 being damaged, and the printed wiring board 4 is inspected in a so-called protected state.

2. The pressure to be applied to the inspecting electrode 2 can be large enough to deform the pressed portion of the elastic sheet 3, thereby making the portion electroconductive, and therefore, a very small pressure is sufficient.

3. The inspecting electrode 2 does not require a special structure and may be an electroconductive body possessing a rigidity necessary for pressing the elastic sheet 3. Therefore, the cost of the inspecting electrode 2 is very low.

In the present method, electrical conduction is obtained by a very small load, as compared with the case of using conventional probes. The reason therefor is presumed to be as follows:

1. Conventional probes are made of rigid metal materials and accordingly the contact thereof with through-hole portions is point-contact, and hence, the contact area is very small. On the other hand, in the present method using a pressure-sensitive electroconductive elastic sheet, the sheet is a flexible elastic one, and therefore, contact takes place at many points.

2. As compared with the size of the front end parts of conventional probes, the size of electroconductive particles used in the pressure-sensitive electroconductive elastic sheet of this invention is very small and accordingly a high stress concentration is caused by a small load.

3. Moreover, metal particles generally have many projections on their surface, which increase the effect of the above stress concentration. Even if one side of the printed wiring board 4 has warps and/or surface unevenesses and is not flat, electrical connection between each through-hole portion 5 and the corresponding inspecting electrode 2 can be ensured because one side of the elastic sheet 3 is allowed to tightly adhere to one side of the printed wiring board 4 by the pressure of the inspecting electrode 2 and thus desired inspection can surely be carried out by a very simple procedure.

Figure 1:
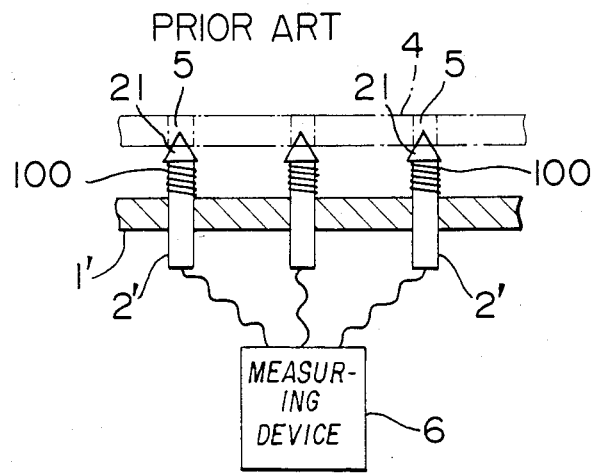
Figure 3:
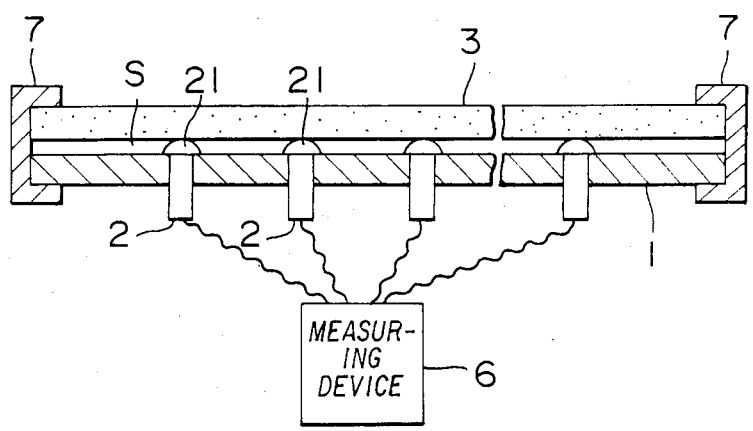
FIG. 3 is a vertically sectional side view illustrating the unit for inspecting a printed wiring board according to this invention.

FIG. 3 illustrates an embodiment of the unit for inspecting a printed wiring board according to this invention which can be suitably used for carrying out the present inspection method. In this embodiment, a pressure-sensitive electroconductive elastic sheet 3, any portions of which become electroconductive in the direction of thickness of the elastic sheet when the portions have been pressed in the same direction, and an insulating, inspecting electrode-holding plate 1 made of, for example, a synthetic resin such as an acrylic resin, a phenolic resin or an epoxy resin, are provided so that the other side of the elastic sheet 3 faces the inspecting electrode-holding plate 1 through a space S, and inspecting electrodes 2 each connected to a measuring device 6 containing a built-in computer are fixed on the inspecting electrode-holding plate 1 at positions corresponding to an arrangement pattern of through-hole portions of a printed wiring board to be inspected, the front end part 21 of each inspecting electrode 2 is projected into the space S from the surface of the inspecting electrode-holding plate 1. In the state where the inspecting electrode-holding plate 1 is arranged so that the top of the front end part 21 of each inspecting electrode 2 is in contact with the other side of the elastic sheet 3, the elastic sheet 3 and the inspecting electrode-holding plate 1 are combined with each other at their peripheral portion by use of a combining member 7 so that the inspecting electrode-holding plate 1 can move toward the elastic sheet 3. Thus a unit for inspecting a printed wiring board is constituted.

Figure 4A:
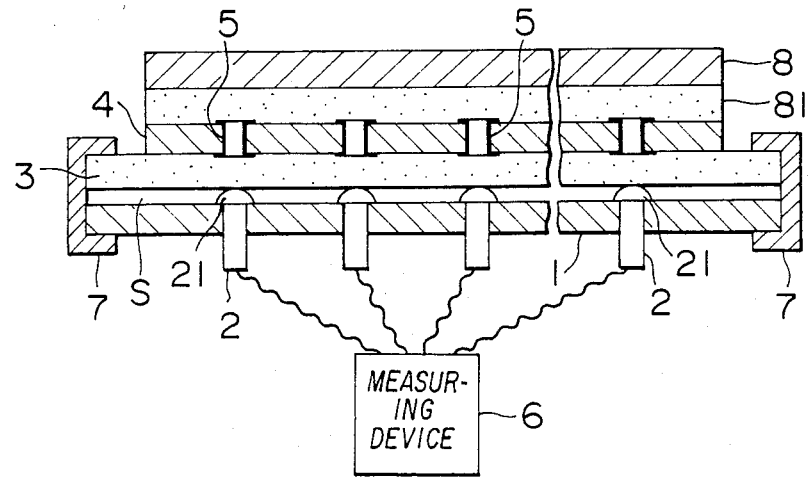
FIGS. 4a and 4b are explanatory views illustrating step by step the inspecting method by use of the inspecting unit illustrated in FIG. 3.
Figure 4B:
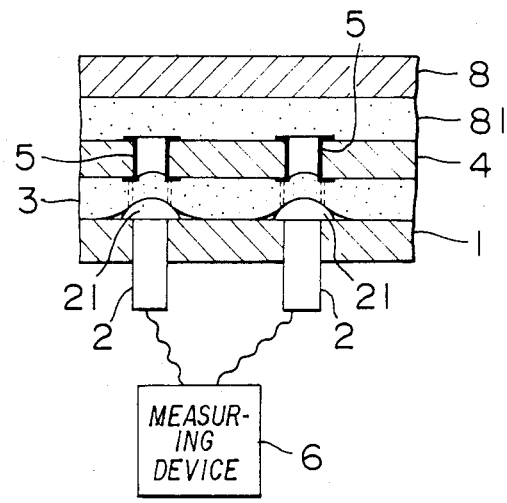

According to this inspecting unit, inspection of a printed wiring board is performed as follows: As shown in FIG. 4a, a printed wiring board 4 to be inspected is superposed on the elastic sheet 3 and if necessary, a supporting plate 8 is superposed on the other side of the printed board 4 through a cushion layer 81. As shown in FIG. 4b, with the supporting plate 8 fixed, the inspecting electrode-holding plate 1 is pressed against the printed wiring board 4 by a pressing mechanism (not shown in the drawings), whereby the portion of the elastic sheet 3 between the edge part of each through-hole portion 5 of the printed wiring board 4 and the corresponding inspecting electrode 2 is made electroconductive as shown by broken lines. Thus, each through-hole portion 5 and the corresponding inspecting electrode 2 are electrically connected through the elastic sheet 3. In this state, electrical connection between through-hole portions 5 is inspected.

According to the above construction of unit, all through-hole portions 5 to be inspected can be electrically connected simultaneously to the corresponding inspecting electrodes 2 through the elastic sheet 3, whereby the intended inspection can be achieved reliably and easily. In addition, since inspecting electrodes 2 are fixed in the inspecting electrode-holding plate 1, and are not required to be movable or to be equipped with a spring, the unit can be made simple and small, and as a result, the cost of the unit including the elastic sheet 3 can be reduced considerably. Further, when the elastic sheet 3 and the inspecting electrode-holding plate 1 are unified as shown in FIGS. 4a and 4b, the unit can conveniently be used in inspection procedure.

Further, as in the above embodiment, when the inspecting electrode-holding plate 1 and the elastic sheet 3 are kept in such a state that the surface of the former can be intimately contacted with the surface of the latter by pressing the inspecting electrode-holding plate 1, portions of the printed wiring board 4 other than the through-hole portions 5 are pressed by the surface of the inspecting electrode-holding plate 1, whereby inspection can be carried out in the state that warps of the printed wiring board 4 have been corrected and any portions of the elastic sheet 3 receive an equal pressing pressure by inspecting electrode 2 and, as a result, inspection can be made with high reliability.

In this invention, an inspecting unit of universal type may be constituted wherein inspecting electrodes 2 are set on the inspecting electrode-holding plate 1 at all positions corresponding to positions on the printed wiring board 4 at which there is a possibility of through-hole portions 5 being formed. In this type of an inspecting unit, the same advantages as described above can be obtained for printed wiring boards having any patterns, and further the elastic sheet 3 existing between the printed wiring board 4 to be inspected and the inspecting electrodes 2 acts as a protective layer, and therefore, there is no fear of the printed wiring circuits being damaged. Generally, in conventional universal type inspecting units, the number of probes 2' is very large, and hence, a large total pressure is needed. However, when this invention is applied to the universal type unit, because a pressure to be applied to each inspecting electrode can be made smaller, a total pressure can be made considerably smaller than that in the case of conventional universal type units. Accordingly, a considerably smaller pressure mechanism can be employed.

The inspecting electrode 2 used in this invention has a front end part 21 which is desirably spherical or planar as shown in FIG. 14. Also, the inspecting electrode 2 may be formed by etching on the inspecting electrode-holding plate. When inspecting electrodes 2 are arranged in a high density, in order to make the distance between two adjacent inspecting electrodes as large as possible, the front end part 21 of these inspecting electrodes preferably has a shape and arrangement as shown in FIGS. 15a and 15b. The height (p) of the top of the inspecting electrode is usually 0.1–0.4 mm.

The elastic sheet 3 used in this invention is a pressure-sensitive electroconductive rubber sheet, any portions of which become electroconductive in the direction of thickness of the rubber sheet when the portions have been pressed in the same direction. The representatives of such a rubber sheet are JSR PCR manufactured by Japan Synthetic Rubber Co., Ltd. which is an anisotropic, pressure-sensitive, electroconductive rubber sheet composed mainly of electroconductive particles and an insulating, high-molecular weight elastomer.

The elastic sheet 3 of this invention is required to have a specific hardness, a specific thickness, and to contain a specific kind of electroconductive particle in a specific amount.

The hardness of the elastic sheet 3 which is measured by JIS AHs is 20 to 55, preferably 20 to 50 and more preferably 30 to 45. When the hardness exceeds 55, a large load is required to press the elastic sheet. When the hardness is less than 20, durability as well as reliability of electrical conduction are reduced.

The thickness of the elastic sheet 3 is 0.1 to 2 mm, preferably 0.2 to 1.5 mm and more preferably 0.3 to 1.3 mm. When the thickness is less than 0.1 mm or more than 2 mm, reliability of electrical conduction is reduced.

As the kind of electroconductive particle to be contained in the elastic sheet 3, it is selected from particles of iron, nickel, cobalt and their alloys as well as silver-or gold-plated particles of these metals or alloys. The average size of the metal particle may generally be varied depending upon the thickness of the elastic sheet 3, but should be within a range of 10 to 200 $\mu$m. When the metal particle has projections on its surface, it is effective for improving the reliability of electrical conduction obtained by a light pressing pressure.

The amount of electroconductive particle to be contained in the elastic sheet 3 is 5 to 30% (volume fraction), preferably 6 to 25% and more preferably 8 to 20%. When the volume fraction is less than 5%, reliability of electrical conduction is low. When the volume fraction exceeds 30%, two adjacent inspecting electrodes are liable to cause shortcircuiting.

In this invention, for pressing inspecting electrodes 2 against the printed wiring board 4 through the elastic sheet 3, a pressure may be applied from either of the inspecting electrode side or the printed wiring board side. As the pressure-applying mechanism, a conventional mechanism can be used as it is.

The inspecting unit of this invention can be used for the inspection of electrical conduction not only between through-hole portions but also between other electroconductive portions of a printed wiring board.

In this invention, when a printed wiring board to be inspected has electroconductive portions on both sides, inspecting electrodes may be allowed to function by providing the elastic sheet on both sides of the printed wiring board. According to such an inspecting method, the intended inspection can be carried out simultaneously for both sides of the printed wiring board, and further electrical connection between electroconductive portions of the front side and electroconductive portions of the back side can also be inspected with ease.

Inspecting electrodes in this invention are generally held by the inspecting electrode-holding plate fixedly. Alternatively, these inspecting electrodes may be held by the holding portion of an inspecting electrode-holding plate having a holding portion made of an insulating elastic material so that the inspecting electrodes can freely regress. The latter case will be explained by referring to FIG. 5.

Figure 5A:
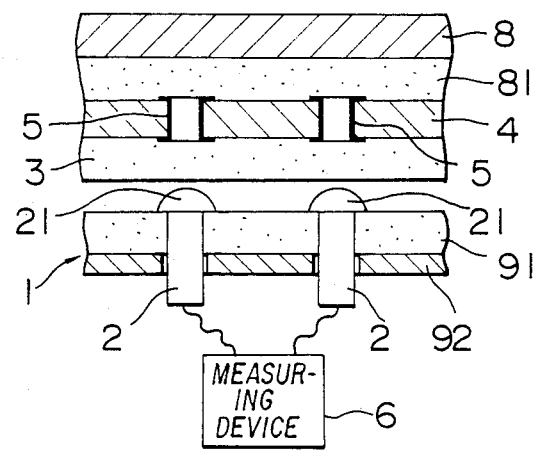
FIGS. 5a and 5b are explanatory views illustrating step by step the inspecting method of this invention.
Figure 5B:
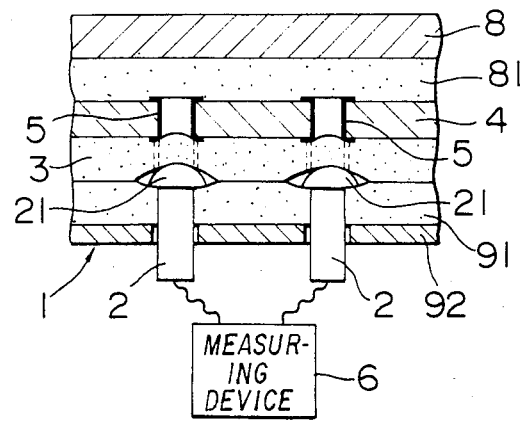

As illustrated in FIGS. 5a and 5b, a printed wiring board 4 to be inspected is superposed on a pressure-sensitive electroconductive elastic sheet 3, any portions of which become electroconductive in the direction of thickness of the elastic sheet when the portions have been pressed in the same direction, and if necessary, a supporting plate 8 is superposed on the other side of the printed wiring board 4 through a cushion layer 81 made of a sponge or any appropriate material; any pair of through-hole portions are chosen from the group of through-hole portions 5 of the printed wiring board 4 and a portion of the elastic sheet 3 corresponding to one of the pair of through-hole portions is pressed between the supporting plate 8 and the inspecting electrode-holding plate 1 connected to a measuring device 6 containing a built-in computer and comprising, for example, a reinforcing plate 92 and a holding portion 91 made of an insulating elastic material placed on the reinforcing plate 92, in such a way that the above portion of the elastic sheet 3 is pressed from the other side of the elastic sheet 3 by the front end part 21 of a corresponding inspecting electrode 2 held by the holding portion 91 of the inspecting electrode-holding plate 1 so as to be able to freely regress, whereby a portion of the elastic sheet 3 between the edge part of said one of the two through-hole portions of the printed wiring board 4 and the corresponding inspecting electrode 2 is made electroconductive as shown by broken lines, and as a result, the inspecting electrode 2 and said one of the two through-hole portions are electrically connected. At the same time, a different portion of the elastic sheet 3 corresponding to the other of the two through-hole portions is pressed likewise by another inspecting electrode 2, whereby electrical conduction between said two through-hole portions is inspected, and thus the printed wiring board 4 is inspected.

In the inspecting electrode-holding plate 1, heights of inspecting electrodes 2 held therein are not equal in some cases. In such cases, when inspecting electrodes 2 are fixed to the inspecting electrode-holding plate 1, in order to allow the unequality of projecting heights of inspecting electrodes 2 to be absorbed by the elastic sheet 3 and to further press inspecting electrodes of the lowest projecting heights with a required force, the elastic sheet 3 need be deformed considerably, and as a result, a very large total pressure becomes necessary. On the other hand, in this invention, inspecting electrodes 2 are fitted to the inspecting electrode-holding plate 1 by its holding portion 91 made of an elastic material so as to be able to freely regress, and hence, unequality in projecting heights of inspecting electrodes 2 can be sufficiently absorbed by the deformation of the holding portion 91, whereby the pressure applied to the elastic sheet 3 by inspecting probe 2 becomes considerably more uniform than the case in which inspecting electrodes 2 are fixed and a total pressure applied to the electrode holding plate 1 for ensuring an electrical connection between the inspecting electrodes 2 and the through-hole portions 5 can be small. Consequently, the pressure-applying mechanism can be made compact and hence an automated inspecting unit can be realized easily.

In forming the holding portion 91 of the inspecting electrode-holding plate 1, there may be used sheets of natural rubber; synthetic rubbers such as SBR, BR, NBR, EPT, IR, silicone rubber and the like, and high molecular weight materials such as polyesters, polyimides and others, and composite materials of these materials with reinforcing materials such as glass fiber, woven fabrics, non-woven fabrics and the like.

The thickness of the elastic sheet 3, the thickness of the holding portion 91 of the inspecting electrode-holding plate 1 and the projecting height of the inspecting electrode 2 from the holding portion 91 are specifically 0.3 to 2.0 mm, 2 to 10 mm and 0.1 to 0.4 mm, respectively. In this example, a load of about 50 g per one inspecting electrode 2 is applied to make deformation, upon which an electrical conduction state can be achieved.

Figure 6:
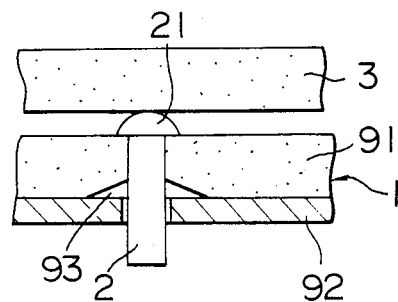
FIGS. 6 and 7 are explanatory sectional views illustrating the key portions of other embodiments of the present unit.
Figure 7:
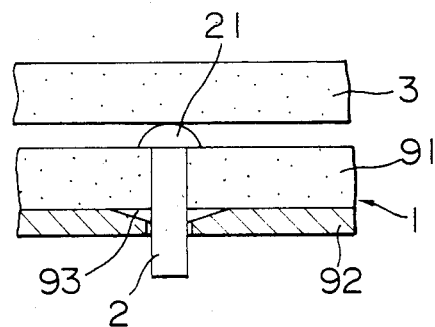

The inspecting unit of this invention may have such a construction that, as illustrated in FIG. 6, a concave portion is formed in the holding portion 91 at the boundary between the reinforcing plate 92 and the holding portion 91 at the circumference of each inspecting electrode 2, or such a construction that, as illustrated in FIG. 7, a concave 93 is formed in the reinforcing plate 92 at the boundary between the reinforcing plate 92 and the holding portion 91 at the circumference of each inspecting electrode 2. In this construction, a regressing distance of the inspecting electrode 2 including the concave can be secured.

Figure 8:
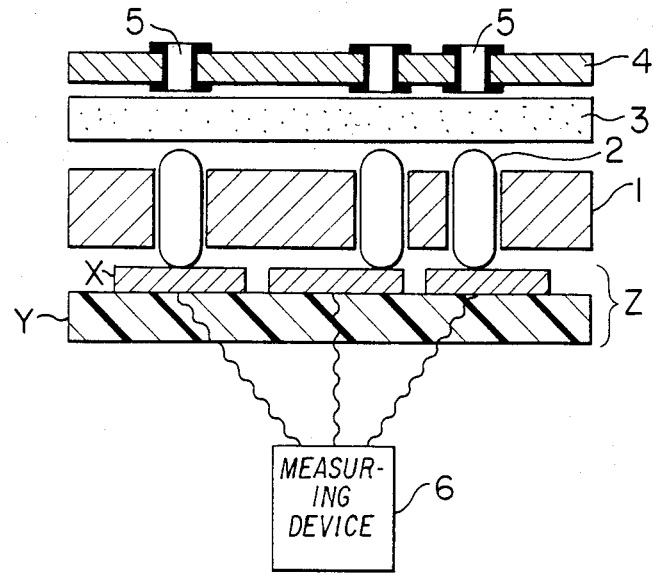
FIGS. 8 and 9 are views illustrating modifications of the present unit.
Figure 9:
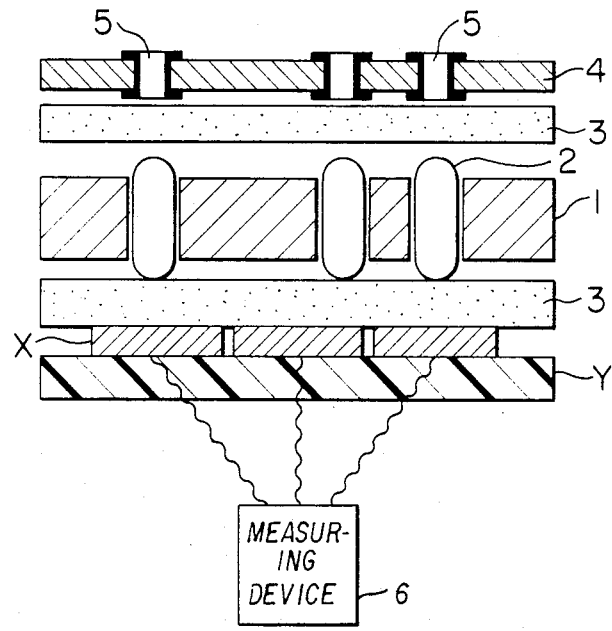

In this invention, as shown in FIGS. 8 and 9, in order to keep the inspecting electrode 2 capable of fitting and removing and capable of regressing in the inspecting electrode-holding plate 1 and connect to the end of the inspecting electrode the wire to the measuring device 6, an electrode unit Z consisting of an electro-deholding plate Y and electrodes X having a shape of, for example, square provided in matrix in the plate Y at positions corresponding to those of the inspecting electrodes is superposed on the inspecting electrode-holding plate so that the end of the inspecting electrode connects to the electrode. With such a construction, the inspecting electrodes can easily be fit or removed in practice, and hence, even in an inspecting unit called a universal type, it is possible to previously remove the unnecessary inspecting electrodes, and as a result, it is made possible to effect the inspection by applying a smaller pressing pressure with a high reliability. Moreover, even if there are conductive portions such as through-holes other than those arranged in the standardized lattice form in the printed wiring board, when said conductive portions are present within such an area that the end of the probe can contact the square-shaped electrode on the electrode unit, the electrical connection between the electrode and said conductive portions can be made possible by changing the position of the hole for holding the inspecting electrode on the inspecting electrode-holding plate. Furthermore, by replacing the above inspecting electrode-holding plate with a previously prepared inspecting electrode-holding plate having holes for holding inspecting electrodes at positions corresponding to those of the conductive portions to be inspected of a printed wiring board, it becomes possible to arrange the inspecting electrodes only at positions corresponding to those of conductive portions of a printed wiring board to be inspected, whereby it becomes possible to easily apply the inspecting unit of this invention to printed wiring boards having various patterns of conductive portions. As in FIG. 9, when a pressure-sensitive electrode-conductive rubber sheet 3, any portions of which become conductive in the direction of thickness of the rubber sheet when the portions have been pressed in the same direction is placed between the inspecting electrode-holding plate and the electrode unit, the pressing pressure can be reduced while keeping the electrical conduction reliability as compared with the case where the rubber sheet is not placed.

Figure 10:
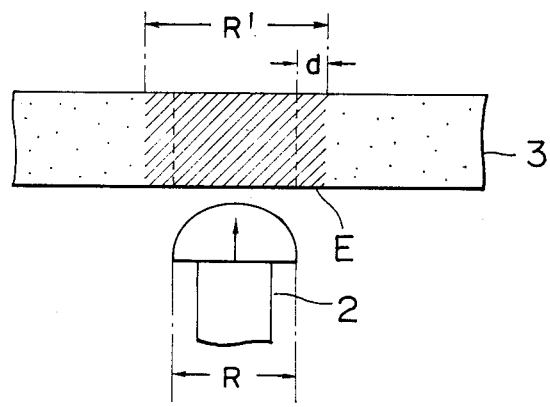
FIG. 10 is an explanatory view illustrating the electroconductive region of an elastic sheet.

When the elastic sheet 3 used in this invention is pressed in its thickness direction, for example, by an inspecting electrode 2 having a spherical front end of a diameter R as shown in FIG. 10, strictly speaking, there is formed an electroconductive region E of a diameter R' larger than the region of the diameter R with which the inspecting electrode 2 is in contact, as shown as a region of oblique lines. The electroconductive area surrounding the region of the diameter R is formed together with the region of the diameter R by the same strain applied and its width d is considerably large.

On the other hand, in recent printed wiring boards, a request for smaller size is very strong and there are actually being taken various countermeasures such as, for example, adoption of shorter distance between through-holes and fitting of a lead between through-holes. It is difficult to apply an inspecting method using the above described elastic sheet 3 to such printed wiring boards.

Figure 11:
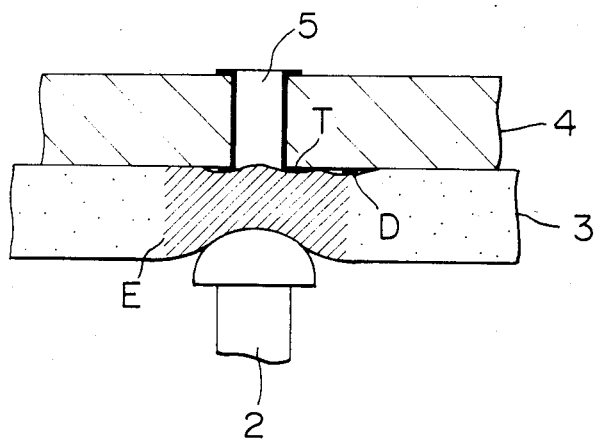
FIG. 11 is a sectional view illustrating a problem of the inspecting method using an elastic sheet.

That is, as shown in FIG. 11, when the inspecting electrode 2 is pressed for obtaining electrical connection with an electroconductive portion T to be inspected, an electroconductive region E of a diameter larger than the diameter R of the inspecting electrode 2 is formed in an elastic sheet 3 and, when another electroconductive portion D exists at a position of a printed wiring board 4 corresponding to the electroconductive region E, the inspecting electrode 2 is electrically connected not only to the electroconductive portion T to be inspected but also to the electroconductive portion D, and hence, highly reliable inspection cannot be carried out.

Of course, inspection free from this problem is made possible by making the diameter of each inspecting electrode 2 smaller. However, it creates new problems such as a large increase in inspecting electrode cost and the like.

The above problem can be solved by using the following preferable inspecting method of this invention.

That is, on the surface of a printed wiring board to be inspected there is placed an insulating thin film mask having holes through which the electroconductive portions to be inspected on said surface are exposed, and on this mask is placed an elastic sheet, any portions of which become electroconductive in the direction of thickness of the elastic sheet when the portions have been pressed in the same direction, after which the elastic sheet is pressed by inspecting electrodes at positions corresponding to the holes of the mask, whereby the inspecting electrodes and the electroconductive portions to be inspected are electrically connected.

The above inspecting method is specifically explained referring to an embodiment below.

Figure 12:
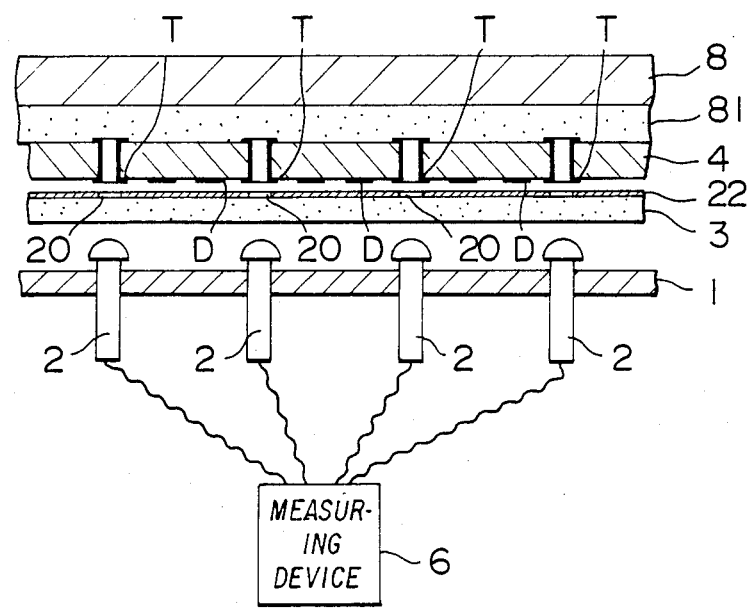
FIG. 12 is a sectional view for illustrating an embodiment of the present method.

As shown in FIG. 12, between the printed wiring board 4 to be inspected and the elastic sheet 3 (for example, JSR PCR manufactured by Japan Synthetic Rubber Co., Ltd.), there is placed an insulating thin film mask 22 (hereinafter referred to only as mask) having holes 20 of a size fit for electroconductive portions to be inspected at positions corresponding to these electroconductive portions T; the elastic sheet 3 is pressed by the inspecting electrodes 2 fixed to an inspecting electrode-holding plate 1, at positions corresponding to the positions of the electroconductive portions T; whereby these corresponding portions of the elastic sheet 3 are pressed between the inspecting electrodes 2 and the electroconductive portions T through the holes 20 of the mask to electrically connect each electroconductive portion T to its corresponding inspecting electrode 2; and in this state, inspection is made.

In the above inspecting method, the shape and size of the holes 20 of the mask 22 are not critical if a minimum hole section is secured which is necessary for obtaining electrical conduction between the electroconductive portion to be inspected and the inspecting electrode through the elastic sheet.

The mask 22 may be formed as a layer on the surface of the side of the elastic sheet 3 facing the printed wiring board 4, by applying an insulating coating to the surface by the use of a printing technique. In this case, not only is the formation of the mask 22 easy but also the registering thereof can be conveniently made through the elastic sheet 3. Alternatively, the mask 22 may be made separately using an insulating resin film and then be inserted between the printed wiring board 4 and the elastic sheet 3 with a register, or this insulating resin film mask may be sticked on the elastic sheet 3 by use of an adhesive, etc.

According to the above method for inspecting a printed wiring board, even if in the elastic sheet 3 is formed electroconductive regions whose diameter is larger than the diameter of each electroconductive portion T to be inspected, only this electroconductive portion T is exposed and connected to its corresponding electroconductive region of the elastic sheet 3 through the hole 20 of the mask 22 and all other portions of the printed wiring board 4 are covered by the mask 22 and electrically insulated from the elastic sheet 3. Therefore, even if another electroconductive portion D exists near the electroconductive portion T to be inspected, the electroconductive portion D is not in contact with the electroconductive region of the elastic sheet 3. As a result, even if each inspecting electrode 2 has a large diameter and accordingly a large electroconductive region is formed in the elastic sheet 3 by each inspecting electrode 2, the inspecting electrode 2 can be electrically connected only to its corresponding electroconductive portion T to be inspected. Thus, the printed wiring board 4 can be inspected with high reliability.

As understood in the above description, the inspecting electrodes 2 are not required to have a small diameter, and therefore, their production is easy and the cost is not high.

A register is necessary between the printed wiring board to be inspected and the inspecting electrode-holding plate for making accurate registering possible between each electroconductive portion of the printed wiring board and its corresponding inspecting electrode of the inspecting electrode-holding plate. This can be done, for example, as follows.

Figure 13:
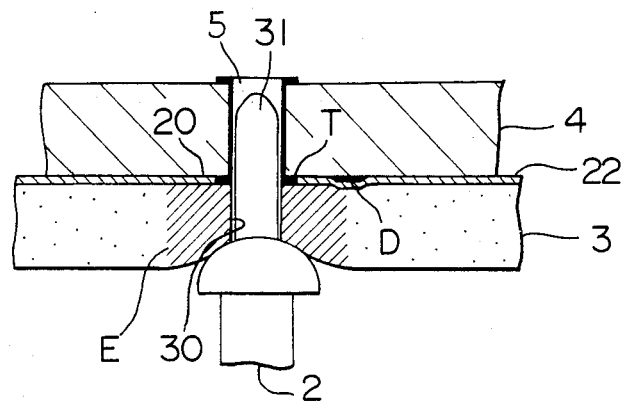
FIG. 13 is a view for illustrating a preferable register in this invention.

As shown in FIG. 13, in an elastic sheet 3, there is formed a registering hole 30 having the same diameter as that of a through-hole H of an electroconductive portion to be inspected, at the position corresponding to that of the through-hole H, and at the top of the corresponding inspecting electrode 2, a projection 31 having a diameter fit for the through-hole H is formed and inserted into the through-hole H through the registering hole 30 of the elastic sheet 3, whereby the registering can be achieved while securing electrical connection. The registering can be accomplished by providing such a registering portion at two places of an inspecting unit.

In respect of a printed wiring board having electroconductive portions to be inspected in a group of many electroconductive portions densely arranged, the use of an elastic sheet enables the inspecting electrodes to be surely and easily connected electrically to the corresponding electroconductive portions to be inspected, thereby enabling the printed wiring board to be inspected with a high reliability.

As is obvious from the foregoing, the present invention provides a method for inspecting a printed wiring board wherein electrical contact with electroconductive portions of the printed wiring board can be secured reliably by a very simple means and accordingly reliable inspection can be carried out, and also provides an inexpensive unit for inspecting a printed wiring board which has a simple structure and can be suitably used for carrying out the above inspecting method.

Referring to Examples, this invention is explained in detail below. However, the Examples are not by way of limitation but by way of illustration.

EXAMPLES 1 AND 2 AND COMPARATIVE EXAMPLE 1

Pressure-sensitive electroconductive elastic sheets having hardness, thickness, and electroconductive particle content as indicated in Table 1 were used, and a gold-plated inspecting electrode made of brass, the top shape of which was a cylinder having a diameter of 1.2 mm and a height of 0.4 mm.

The inspecting electrode-holding plate used was an acrylic resin plate having a thickness of 15 mm and having a total of 1,600 inspecting electrode-holding holes arranged in 40 rows at a pitch of 2.54 mm, and the inspecting electrodes were adhered to the inspecting electrode-holding holes so that the tops of the inspecting electrode were on one flat surface. A commercially available sponge having a thickness of 10 mm was used as the cushion layer, to constitute a unit for inspecting a printed wiring board according to this invention.

As the printed wiring board to be inspected was used a commercially available universal board, and the through-hole portions of the universal board were registered with the inspecting electrodes of the above inspecting unit, and the two were pressed to each other, thereby measuring the electrical resistance between the through-hole portion and the inspecting electrode varying the pressing load.

The pressing loads used for the measurement were 10 g, 20 g, 30 g, 40 g, 60 g, 100 g and 150 g per one inspecting electrode.

The same measurement was conducted on 20 universal boards. When the electrical resistance was less than 10 ohms, it was judged to be electrically conducted, and a conduction percentage at each load was calculated.

The results obtained are shown in Table 2, in which "x" refers to a conduction percentage of less than 85%, "Δ" to a conduction percentage of 85% to less than 100%, and "o" to 100%.

TABLE 1

|  | Comparative Example 1 | Example 1 | Example 2 |
|---|---|---|---|
| Hardness (JIS A) | 52 | 48 | 38 |
| Thickness (mm) | 1.6 | 1.2 | 0.8 |
| Electroconductive particle content (% by volume) | 28 | 20 | 12 |

TABLE 2

| Load per inspecting electrode | Example 1 | Example 2 | Example 3 |
|---|---|---|---|
| 10 g | x | x | Δ |
| 20 g | x | Δ | Δ |
| 30 g | Δ | Δ | o |
| 40 g | Δ | o | o |
| 60 g | o | o | o |
| 80 g | o | o | o |
| 100 g | o | o | o |
| 150 g | o | o | o |

In comparative Example 1, a complete electrical connection was obtained between the inspecting electrode and the printed wiring board at a load of 60 g or more per one inspecting electrode.

In Example 1, said load was 40 g or more and in Example 2 it was 30 g or more.

What is claimed is:

1. A method for inspecting a printed wiring board, which comprises steps of superposing, on a printed wiring board to be inspected, a pressure-sensitive, electroconductive, elastic sheet containing 5 to 20% (volume fraction) of electroconductive metal particles, any portions of which sheet become electroconductive in the direction of thickness of the elastic sheet when the portions have been pressed in the same direction, and pressing the elastic sheet at portions corresponding to those of the electroconductive portions of said printed wiring board by use of inspecting electrodes, thereby electrically connecting the intended electroconductive portions of the printed wiring board to the corresponding inspecting electrodes.

2. An inspecting method according to claim 1, wherein the pressure-sensitive electroconductive elastic sheet has a hardness of 20 to 55 as measured according to JIS AHs and a thickness of 0.1 to 2 mm.

3. An inspecting method according to claim 1, wherein the pressure-sensitive electroconductive elastic sheet has a hardness of 20 to 50 as measured in accordance with JIS AHs, and a thickness of 0.2 to 1.5 mm.

4. An inspecting method according to claim 1, wherein the pressure-sensitive electroconductive elastic sheet has a hardness of 30 to 45 as measured in accordance with JIS AHs and a thickness of 0.3 to 1.3 mm and contains 8 to 20% (volume fraction) of electroconductive particles.

5. An inspecting method according to any one of claims 1 to 4, wherein the inspecting electrodes are held by the holding means of an inspecting electrode-holding plate, said holding means being made of an insulating elastic substance, so that the inspecting electrodes are capable of regressing.

6. An inspecting method according to any one of claims 1 to 4, wherein the group of many inspecting electrodes are held so as to be capable of fitting and removing and also capable of regressing in the insulating, inspecting-electrode-holding plate.

7. An inspecting method according to any one of claims 1 to 4, wherein on the surface of the printed wiring board to be inspected is placed an insulating thin film mask having holes, through which the electroconductive portions to be inspected of the surface of the printed wiring board are exposed.

8. An inspecting method according to claim 5, wherein the group of many inspecting electrodes are held so as to be capable of fitting and removing and also capable of regressing in the insulating, inspecting-electrode-holding plate.

9. An inspecting method according to claim 5, wherein on the surface of the printed wiring board to be inspected is placed an insulating thin film mask having holes, through which the electroconductive portions to be inspected of the surface of the printing board are exposed.

10. An inspecting method according to claim 6, wherein on the surface of the printed wiring board to be inspected is placed an insulating thin film mask having holes, through which the electroconductive portions to be inspected of the surface of the printed wiring board are exposed.

11. A unit for inspecting a printed wiring board which comprises a pressure-sensitive, electroconductive, elastic sheet which is to be superposed on a printed wiring board to be inspected, said sheet containing 5 to 20% (volume fraction) of electroconductive metal particles, any portions of which sheet become electroconductive in the direction of thickness of the elastic sheet when the portions have been pressed in the same direction, an insulating, inspecting-electrode-holding plate provided so as to face the side of the elastic sheet opposite to the side to be contacted with the printed wiring board and to be spaced therefrom, and so that the inspecting electrode-holding plate is provided so that is can be pressed in a direction in which it approaches the printed wiring board, and a group of many inspecting electrodes held in the inspecting electrode-holding plate so as to be projected from the surface of the inspecting electrode-holding plate into the space, said group of many inspecting electrodes being arranged so as to correspond to an arrangement pattern of electroconductive portions of the printed wiring board to be inspected.

12. An inspecting unit according to claim 11, wherein the group of many inspecting electrodes are held by the holding means of the inspecting electrode-holding plate, said means being made of an isulating elastic substance, so that the probes are capable of regressing.

13. An inspecting unit according to claim 11, wherein the group of many inspecting electrodes are held so as to be capable of fitting and removing and also capable of regressing in the insulating, inspecting-electrode-holding plate.

* * * * *